United States Patent
Ohno

(10) Patent No.: US 10,043,735 B2
(45) Date of Patent: Aug. 7, 2018

(54) SEMICONDUCTOR MODULE, SEMICONDUCTOR DEVICE, AND METHOD FOR MANUFACTURING SEMICONDUCTOR DEVICES

(71) Applicant: TOYOTA JIDOSHA KABUSHIKI KAISHA, Toyota-shi, Aichi-ken (JP)

(72) Inventor: Hirotaka Ohno, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/988,180

(22) Filed: Jan. 5, 2016

(65) Prior Publication Data

US 2016/0247793 A1  Aug. 25, 2016

(30) Foreign Application Priority Data

Feb. 25, 2015 (JP) .................. 2015-035491

(51) Int. Cl.
*H01L 23/02* (2006.01)
*H01L 23/495* (2006.01)
(Continued)

(52) U.S. Cl.
CPC ........ *H01L 23/49562* (2013.01); *H01L 23/40* (2013.01); *H01L 23/4012* (2013.01); *H01L 23/473* (2013.01); *H01L 23/49575* (2013.01); *H01L 25/117* (2013.01); *H01L 25/50* (2013.01); *H01L 23/49537* (2013.01)

(58) Field of Classification Search
CPC . H01L 23/055; H01L 27/3223; H01L 21/563; H01L 2225/0651; H01L 2224/49171; H01L 2924/181

USPC ........ 257/773, 784, 786, 787, 686; 438/127, 438/106
See application file for complete search history.

(56) References Cited

U.S. PATENT DOCUMENTS

| 2004/0183188 A1 | 9/2004 | Oohama |
| 2009/0201708 A1 | 8/2009 | Ohkouchi et al. |

(Continued)

FOREIGN PATENT DOCUMENTS

| JP | H4-284656 A | 10/1992 |
| JP | 2005-045185 A | 2/2005 |

(Continued)

*Primary Examiner* — S. V. Clark
(74) *Attorney, Agent, or Firm* — Oliff PLC

(57) ABSTRACT

A semiconductor module includes: first semiconductor devices; second semiconductor devices; a first and second wires. Each first semiconductor device comprises: first sealing resin; first-third terminals; a first semiconductor chip connected to the first and third terminals. Each second semiconductor device comprises: second sealing resin; fourth-sixth terminals; a second semiconductor chip connected to the fourth and fifth terminals, and not connected to the sixth terminal. The first and second semiconductor devices are stacked along a stacking direction. The first terminals and the fourth terminals are arranged in a line along the stacking direction. The second terminals and the fifth terminals are arranged in a line along the stacking direction. The third terminals and the sixth terminals are arranged in a line along the stacking direction. The first wire is connected to the fifth terminals. The second wire is connected to the third terminals.

6 Claims, 15 Drawing Sheets

(51) Int. Cl.
*H01L 25/11* (2006.01)
*H01L 25/00* (2006.01)
*H01L 23/40* (2006.01)
*H01L 23/473* (2006.01)

(56) References Cited

U.S. PATENT DOCUMENTS

| | | | |
|---|---|---|---|
| 2013/0107548 A1* | 5/2013 | Kim | H01L 33/62 |
| | | | 362/373 |
| 2014/0035112 A1 | 2/2014 | Kadoguchi et al. | |
| 2016/0079221 A1* | 3/2016 | Inokuchi | H01L 25/07 |
| | | | 257/675 |

FOREIGN PATENT DOCUMENTS

| | | |
|---|---|---|
| JP | 2009-188346 A | 8/2009 |
| JP | 2010-118712 A | 5/2010 |
| JP | 2012-235081 A | 11/2012 |
| JP | WO2015/001648 A1 | 1/2015 |
| WO | 2015/001648 A1 | 1/2015 |

* cited by examiner

SEMICONDUCTOR MODULE, SEMICONDUCTOR DEVICE, AND METHOD FOR MANUFACTURING SEMICONDUCTOR DEVICES

CROSS-REFERENCE TO RELATED APPLICATION

This application claims priority to Japanese Patent Application No. 2015-035491 filed on Feb. 25, 2015, the entire contents of which are hereby incorporated by reference into the present application.

TECHNICAL FIELD

A technology disclosed herein relates to a semiconductor module, a semiconductor device, and a method for manufacturing semiconductor devices.

DESCRIPTION OF RELATED ART

Japanese Patent Application Publication No. 2012-235081 A discloses a semiconductor module including a plurality of semiconductor devices that is stacked. Each of the semiconductor devices includes three terminals (namely a high-potential-side power output terminal, a low-potential-side power output terminal, and an output terminal). When viewed along a stacking direction, the semiconductor devices are stacked so that terminals of the same type overlap each other. That is, the semiconductor devices are stacked so that each group of terminals of the same type forms a line along the stacking direction. A semiconductor module of this type includes a high-potential-side wire extending along the line of high-potential-side power output terminals. The high-potential-side wire is connected to semiconductor chips via the high-potential-side power output terminals. Further, the semiconductor module includes a low-potential-side wire extending along the line of low-potential-side power output terminals. The low-potential-side wire is connected to semiconductor chips via the low-potential-side power output terminals. This structure can shorten a distance over which each wire has to be routed, thus enabling a reduction in size of the semiconductor module.

SUMMARY

There has recently been a case were two-terminal semiconductor devices are used as semiconductor devices that configure a semiconductor module. For example, there is a semiconductor module in which a plurality of three-terminal semiconductor devices and a plurality of two-terminal semiconductor devices are stacked. In this structure, three-terminal semiconductor devices each including first to third terminals and two-terminal semiconductor devices each including fourth and fifth terminals are stacked. In this case, the first terminals and the fourth terminals are arranged in a line. Further, the second terminals and the fifth terminals are arranged in a line. Furthermore, the third terminals are arranged in a line. In this structure, too, at least one line of terminals can be connected to a common wire. This enables the reduction in size of the semiconductor module.

Further, there is a semiconductor module in which two types of two-terminal semiconductor devices are stacked. In this structure, first semiconductor devices each including first and second terminals and second semiconductor devices each including third and fourth terminals are stacked. In this case, the first terminals and the third terminals are arranged in a line. Further, only the second terminals are arranged in a line. Furthermore, only the fourth terminals are arranged in a line. In this structure, too, at least one line of terminals can be connected to a common wire. This enables the reduction in size of the semiconductor module.

Each of the terminals of the semiconductor devices configuring the aforementioned semiconductor module projects outward from sealing resin sealing a respective semiconductor chips. Manufacturing of semiconductor devices of this type includes molding resin to form sealing resin with which each semiconductor chip is sealed. In the molding of the resin, a semi-product including a semiconductor chip and a plurality of terminals connected to the semiconductor chip is set to a mold. At this occasion, each of the terminals of the semi-product is arranged in terminal receiving grooves of the mold. After that, the mold is closed, and the resin is introduced into a cavity, whereby the semiconductor chip is sealed with the sealing resin. Since the resin does not flow into the terminal receiving grooves, none of the terminals is covered with the resin. For this reason, after the molding of the resin, each of the terminals projects from inside to outside of the sealing resin.

In a case, such as that described above, when two-terminal semiconductor devices and three-terminal semiconductor devices are used in one semiconductor module, it is necessary to use separate molds for molding resin to manufacture two-terminal semiconductor devices and for molding resin to manufacture three-terminal semiconductor devices. That is, the mold for manufacturing the three-terminal semiconductor devices includes three terminal receiving grooves. Therefore, using this mold for molding resin to manufacture the two-terminal semiconductor devices undesirably results in an absence of a terminal to be located in one of the terminal receiving grooves, thus making this terminal receiving groove empty. For this reason, an attempt to mold resin to manufacture the two-terminal semiconductor devices results in a flow of the resin into the empty terminal receiving groove, thus making it impossible to obtain the semiconductor devices in a desired shape. Therefore, it is impossible to manufacture the two-terminal semiconductor devices and the three-terminal semiconductor devices using a common mold.

Also in a case, such as that described above, where two types of two-terminal semiconductor devices (first semiconductor devices and second semiconductor devices) are used in one semiconductor module, it is necessary to use separate molds for molding resin to manufacture the first semiconductor devices and for molding resin to manufacture the second semiconductor devices. That is, as described above, the second terminals of the first semiconductor devices and the fourth terminals of the second semiconductor devices are located to constitute different lines. Therefore, the position of the second terminal in each first semiconductor device and the position of the fourth terminal in each second semiconductor device are different. This makes it impossible to allow the second terminal and the fourth terminal to share a same terminal receiving groove. Alternatively, it is conceivable to use a mold having both a terminal receiving groove for the second terminal and a terminal receiving groove for the fourth terminal. In this case, however, the terminal receiving groove for the fourth terminal is empty when the first semiconductor device is manufactured, or the terminal receiving groove for the second terminal is empty when the second semiconductor device is manufactured. For this reason, resin flows into the empty terminal receiving groove, thus making it impossible to obtain a semiconductor device in a desired shape. Therefore, it is impossible to manufacture the first semiconductor devices and the second semiconductor devices using a common mold.

The foregoing description has been given by taking two-terminal and three-terminal semiconductor devices as examples. However, similar problems occur also simply when the numbers of terminals are different. That is, problems similar to those described above occur in a case where a plurality of semiconductor devices including different numbers of terminals is used or in a case where a plurality of semiconductor devices including terminals differing in position from each other is used. Therefore, the present disclosure provides a structure of a semiconductor module in which different types of semiconductor devices are used and which can be efficiently manufactured, a structure of a semiconductor device related thereto, and a method for manufacturing semiconductor devices.

A semiconductor module disclosed herein comprises: a plurality of first semiconductor devices; a plurality of second semiconductor devices; a first wire; and a second wire. Each of the first semiconductor devices comprises: first sealing resin; first, second, and third terminals each of which projects from inside to outside of the first sealing resin; a first semiconductor chip located inside the first sealing resin and connected to at least the first and third terminals. Each of the second semiconductor devices comprises: second sealing resin; fourth, fifth, and sixth terminals each of which projects from inside to outside of the second sealing resin; a second semiconductor chip located inside the second sealing resin, connected to the fourth and fifth terminals, and not connected to the sixth terminal. The first semiconductor devices and the second semiconductor devices are stacked along a stacking direction. The first terminals and the fourth terminals are arranged in a line along the stacking direction. The second terminals and the fifth terminals are arranged in a line along the stacking direction. The third terminals and the sixth terminals are arranged in a line along the stacking direction. The first wire extends along the line of the second terminals and the fifth terminals, and is connected to the fifth terminals. The second wire extends along the line of the third terminals and the sixth terminals, and is connected to the third terminals.

It should be noted that each of the first semiconductor devices may include one semiconductor chip or a plurality of semiconductor chips located inside the first sealing resin. That is, each of the first semiconductor devices may include one first semiconductor chip or a plurality of first semiconductor chips. In a case where each of the first semiconductor devices includes a plurality of first semiconductor chips, the first terminal may only be connected to at least one of the first semiconductor chips. Further, the third terminal may only be connected to at least one of the first semiconductor chips. It should also be noted that each of the second semiconductor devices may include one semiconductor chip or a plurality of semiconductor chips located inside the second sealing resin. That is, each of the second semiconductor devices may include one second semiconductor chip or a plurality of second semiconductor chips. In a case where each of the second semiconductor devices includes a plurality of second semiconductor chips, the fourth terminal may only be connected to at least one of the second semiconductor chips. Further, the fifth terminal may only be connected to at least one of the second semiconductor chips.

Further, each of the second terminals may or may not be connected to the respective first semiconductor chip. The first wire may or may not be connected to the second terminals.

In the present disclosure, names of the terminals are not intended to indicate an order in which the terminals are arranged. Therefore, the third terminal may be located between the first terminal and the second terminal. Further, the sixth terminal may be located between the fourth terminal and the fifth terminal.

In this semiconductor module, each of the first semiconductor devices includes first to third terminals, and each of the second semiconductor devices includes fourth to sixth terminals. Since both the first semiconductor devices and the second semiconductor devices each include three terminals, it is possible to manufacture a first semiconductor device and a second semiconductor device using a common mold.

Further, in this semiconductor module, each sixth terminal is not connected to the respective second semiconductor chip. For this reason, the second wire is not connected to the second semiconductor chips via the sixth terminals. That is, each sixth terminal is a dummy terminal that does not serve as a current pathway.

On the other hand, the second terminal of each of the first semiconductor devices may or may not be connected to the respective first semiconductor chip. That is, the second terminal may be a valid terminal or a dummy terminal. In a case where the first wire is connected to the first semiconductor chips via the second terminals, each second terminal is a valid terminal. In this case, first and second semiconductor devices including different numbers of valid terminals can be manufactured using a common mold. That is, a semiconductor module including semiconductor devices including different numbers of valid terminals can be efficiently manufactured. In a case where the first wire is not connected to the first semiconductor chips via the second terminals, each second terminal is a dummy terminal. In this case, first and second semiconductor devices including valid terminals differing in position from each other can be manufactured using a common mold. That is, a semiconductor module including semiconductor devices including valid terminals differing in position from each other can be efficiently manufactured.

DETAILED DESCRIPTION

Embodiment 1

Figure 1:
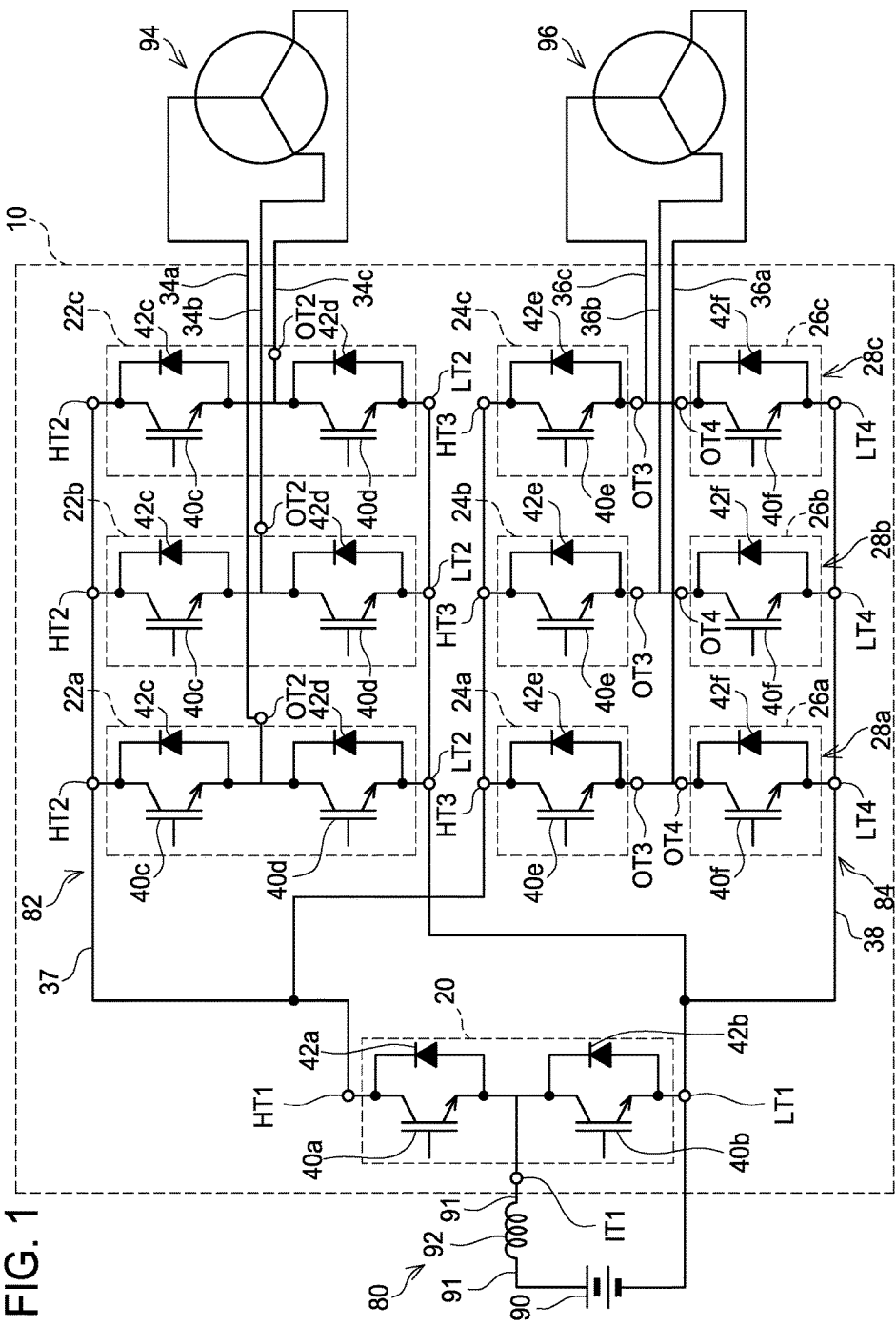
FIG. 1 is a circuit diagram of a semiconductor module 10.

FIG. 1 is a circuit diagram of a semiconductor module 10 according to Embodiment 1. As shown in FIG. 1, the semiconductor module 10 is connected to a power source 90, a reactor 92, and two motors 94 and 96. The semiconductor module 10 includes a semiconductor device 20, three semiconductor devices 22a to 22c, three semiconductor devices 24a to 24c, and three semiconductor devices 26a to 26c. The three semiconductor devices 22a to 22c may be hereinafter collectively referred to as "semiconductor devices 22". The three semiconductor devices 24a to 24c may be hereinafter collectively referred to as "semiconductor devices 24". The three semiconductor devices 26a to 26c may be hereinafter collectively referred to as "semiconductor devices 26". Each of the semiconductor devices 20, 22, 24, and 26 is a component including a semiconductor chip and resin covering the semiconductor chip.

The semiconductor device 20 includes two IGBTs 40a and 40b and two diodes 42a and 42b. The two IGBTs 40a and 40b are connected in series to each other. The diode 42a is connected in antiparallel to the IGBT 40a (so that an anode of the diode 42a is connected to an emitter of the IGBT 40a and a cathode of the diode 42a is connected to a collector of the IGBT 40a). The diode 42b is connected in antiparallel to the IGBT 40b. The semiconductor device 20 includes a high-potential terminal HT1 connected to the collector of the IGBT 40a, a low-potential terminal LT1 connected to an emitter of the IGBT 40b, and an input terminal IT1 connected to the emitter of the IGBT 40a and a collector of the IGBT 40b. The high-potential terminal HT1 is connected to a high-potential bus bar 37. The low-potential terminal LT1 is connected to a low-potential bus bar 38. The input terminal IT1 is connected to a positive terminal of the power source 90 via power-supply wire 91. Further, the reactor 92 is interposed in the power-supply wire 91. A negative terminal of the power source 90 is connected to the low-potential bus bar 38. A voltage converter 80 is configured by the reactor 92 and the semiconductor device 20. The voltage converter 80 boosts an output voltage of the power source 90 and outputs the boosted voltage between the high-potential bus bar 37 and the low-potential bus bar 38.

Figure 2:
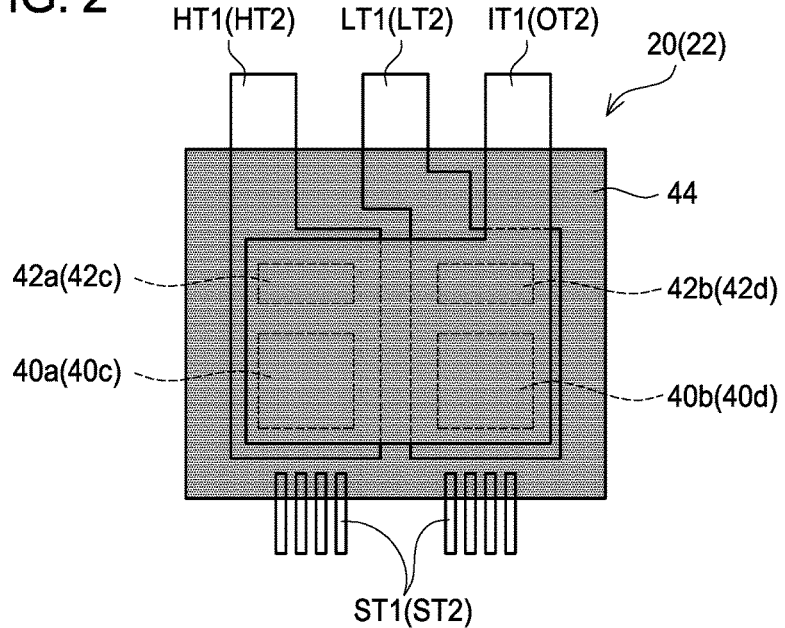
FIG. 2 is a plan view of semiconductor devices 20 and 22.

FIG. 2 shows the semiconductor device 20. As shown in FIG. 2, the semiconductor device 20 includes a semiconductor chip 40a configuring the IGBT 40a, a semiconductor chip 40b configuring the IGBT 40b, a semiconductor chip 42a configuring the diode 42a, and a semiconductor chip 42b configuring the diode 42b. Further, as mentioned above, the semiconductor device 20 includes the high-potential to HT1, the low-potential terminal LT1, and the input terminal IT1. Furthermore, the semiconductor device 20 includes a plurality of signal terminals ST1 and the like. The high-potential terminal HT1 is connected to a back surface of the semiconductor chip 40a (i.e. the collector of the IGBT 40a) and a back surface of the semiconductor chip 42a (i.e. the cathode of the diode 42a). The low-potential terminal LT1 is connected to a back surface of the semiconductor chip 40b (i.e. the emitter of the IGBT 40b) and a back surface of the semiconductor chip 42b (i.e. an anode of the diode 42b). The input terminal IT1 is connected to a front surface of the semiconductor chip 40a (i.e. the emitter of the IGBT 40a), a front surface of the semiconductor chip 42a (i.e. the anode of the diode 42a), a front surface of the semiconductor chip 40b (i.e. the collector of the IGBT 40b), and a front surface of the semiconductor chip 42b (i.e. a cathode of the diode 42b). Each of the signal terminals ST1 is connected to a gate of either one of the IGBT 40a and the IGBT 40b. The semiconductor chips 40a, 40b, 42a, and 42b and portions of the terminals HT1, LT1, IT1, and ST1 on which these semiconductor chips are mounted are covered with sealing resin 44. The terminals HT1, LT1, IT1, and ST1 project from inside to outside of the sealing resin 44.

Each of the semiconductor devices 22 includes two IGBTs 40c and 40d and two diodes 42c and 42d. The two IGBTs 40c and 40d are connected in series to each other. The diode 42c is connected in antiparallel to the IGBT 40c. The diode 42d is connected in antiparallel to the IGBT 40d. Each of the semiconductor devices 22 includes a high-potential terminal HT2 connected to a collector of the IGBT 40c, a low-potential terminal LT2 connected to an emitter of the IGBT 40d, and an output terminal OT2 connected to an emitter of the IGBT 40c and a collector of the IGBT 40d. The high-potential terminal HT2 is connected to the high-potential bus bar 37. The low-potential terminal LT2 is connected to the low-potential bus bar 38. The output terminal OT2 is connected to an output wire. More specifically, the output terminal OT2 of the semiconductor device 22a is connected to an output wire 34a. The output terminal OT2 of the semiconductor device 22h is connected to an output wire 34b. The output terminal OT2 of the semiconductor device 22c is connected to an output wire 34c. The other ends of the output wires 34a to 34c are connected to the motor 94. The three semiconductor devices 22 configure an inverter 82. The inverter 82 converts a direct-current voltage between the high-potential bus bar 37 and the low-potential bus bar 38 into a three-phase alternating-current voltage and supplies the three-phase alternating-current voltage to the motor 94.

Each of the semiconductor devices 22 has substantially the same structure as the semiconductor device 20 shown in FIG. 2. That is, each of the semiconductor devices 22 includes a semiconductor chip 40c configuring the IGBT 40c, a semiconductor chip 40d configuring the IGBT 40d, a semiconductor chip 42c configuring the diode 42c, and a semiconductor chip 42d configuring the diode 42d. Further, as mentioned above, each of the semiconductor devices 22 includes the high-potential terminal HT2, the low-potential terminal LT2, and the output terminal OT2. Furthermore, each of the semiconductor devices 22 includes a plurality of signal terminals ST2 and the like. The high-potential terminal HT2 is connected to a back surface of the semiconductor chip 40c (i.e. the collector of the IGBT 40c) and a back surface of the semiconductor chip 42c (i.e. a cathode of the diode 42c). The low-potential terminal LT2 is connected to a back surface of the semiconductor chip 40d (i.e. the emitter of the IGBT 40d) and a back surface of the semiconductor chip 42d (i.e. an anode of the diode 42d). The output terminal OT2 is connected to a front surface of the semiconductor chip 40c (i.e. the emitter of the IGBT 40c), a front surface of the semiconductor chip 42c (i.e. an anode of the diode 42c), a front surface of the semiconductor chip 40d (i.e. the collector of the IGBT 40d), and a front surface of the semiconductor chip 42d (i.e. a cathode of the diode 42d). Each of the signal terminals ST2 is connected to a gate of either one of the IGBT 40c and the IGBT 40d. The semiconductor chips 40c, 40d, 42c, and 42d and portions of the terminals HT2, LT2, OT2, and ST2 on which these semiconductor chips are mounted are covered with the sealing resin 44. The terminals HT2, LT2, OT2, and ST2 project from inside to outside of the sealing resin 44.

The semiconductor devices 24 and the semiconductor devices 26 are connected in series, respectively, between the high-potential bus bar 37 and the low-potential bus bar 38. The semiconductor devices 24 and the semiconductor devices 26, which are connected in series, form series circuits 28, respectively. The three series circuits 28a to 28c are connected in parallel between the high-potential bus bar 37 and the low-potential bus bar 38.

Each of the semiconductor devices 24 includes an IGBT 40e and a diode 42e. The diode 42e is connected in antiparallel to the IGBT 40e. Each of the semiconductor devices 24 includes a high-potential terminal HT3 connected to a collector of the IGBT 40e and an output terminal OT3 connected to an emitter of the IGBT 40e. The high-potential terminal HT3 is connected to the high-potential bus bar 37. The output terminal OT3 is connected to an output terminal OT4 of the corresponding semiconductor device 26. Each of the semiconductor devices 26 includes an IGBT 40f and a diode 42f. The diode 42f is connected in antiparallel to the IGBT 40f. Each of the semiconductor devices 26 includes a low-potential terminal LT4 connected to an emitter of the IGBT 40f and an output terminal OT4 connected to a collector of the IGBT 40f The low-potential terminal LT4 is connected to the low-potential bus bar 38. The output terminal OT4, together with the output terminal OT3 of the corresponding semiconductor device 24, is connected to an output wire 36. More specifically, the output terminals OT3 and OT4 of the series circuit 28a are connected to an output wire 36a. The output terminals OT3 and OT4 of the series circuit 28b are connected to an output wire 36b. The output terminals OT3 and OT4 of the series circuit 28c are connected to an output wire 36c. The other ends of the output wires 36a to 36c are connected to the motor 96. The three series circuits 28 configure an inverter 84. The inverter 84 converts a direct-current voltage between the high-potential bus bar 37 and the low-potential bus bar 38 into a three-phase alternating-current voltage and supplies the three-phase alternating-current voltage to the motor 96.

Figure 3:
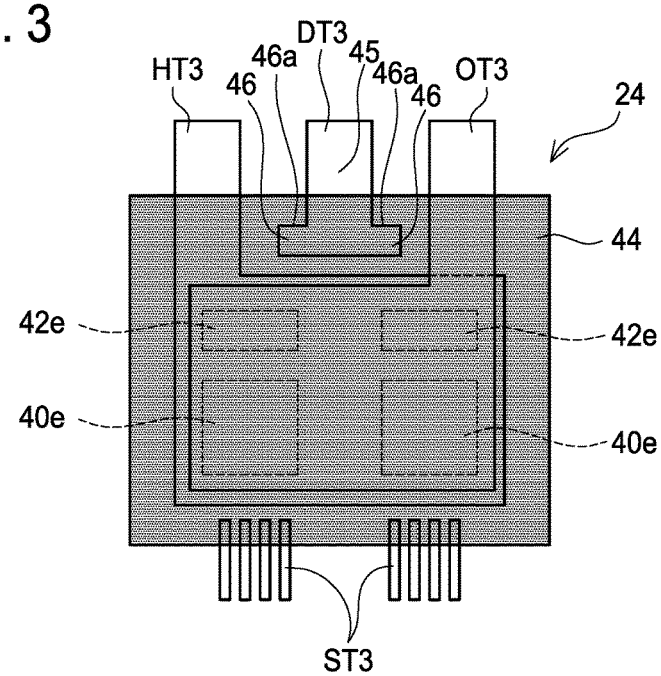
FIG. 3 is a plan view of a semiconductor device 24.

FIG. 3 shows each of the semiconductor devices 24. As shown in FIG. 3, each of the semiconductor devices 24 includes semiconductor chips 40e configuring the IGBT 40e and semiconductor chips 42e configuring the diode 42e. The IGBT 40e is configured by the two semiconductor chips 40e. For this reason, the IGBT 40e is higher in current capacity than the IGBTs 40a to 40d. Further, the diode 42e is configured by the two semiconductor chips 42e. For this reason, the diode 42e is higher in current capacity than the diodes 42a to 42d. Further, as mentioned above, each of the semiconductor devices 24 includes the high-potential terminal HT3 and the output terminal OT3. Furthermore, each of the semiconductor devices 24 includes a dummy terminal DT3, a plurality of signal terminals ST3, and the like. The high-potential terminal HT3 is connected to back surfaces of the two semiconductor chips 40e (i.e. the collector of the IGBT 40e) and back surfaces of the two semiconductor chips 42e (i.e. a cathode of the diode 42e). The output terminal OT3 is connected to front surfaces of the two semiconductor chips 40e (i.e. the emitter of the IGBT 40e) and front surfaces of the two semiconductor chips 42e (i.e. an anode of the diode 42e). The dummy terminal DT3 is connected to neither the two semiconductor chips 40e nor the two semiconductor chips 42e. The dummy terminal DT3 is spaced from each of the semiconductor chips 40e and 42e. Each of the signal terminals ST3 is connected to a gate of the IGBT 40e. The semiconductor chips 40e and 42e and portions of the terminals HT3, OT3, and ST3 on which these semiconductor chips are mounted are covered with the sealing resin 44. Further, a base end of the dummy terminal DT3 is also covered with the sealing resin 44. The sealing resin 44 insulates the dummy terminal DT3 from the semiconductor chips 40e and 42e. The terminals HT3, DT3, OT3, and ST3 project from inside to outside of the sealing resin 44.

It should be noted that the dummy terminal DT3 includes a portion covered with the sealing resin 44 and serving as an anchor portion 46. The anchor portion 46 projects from a body portion 45 of the dummy terminal DT3 (i.e. a portion of the dummy terminal DT3 that extends from inside to outside of the sealing resin 44) along a direction orthogonal to the body portion 45 (i.e. a width direction of the body portion 45). For this reason, when the dummy terminal DT3 is pulled from the inside toward the outside, a surface 46a that is closer to the outside of the anchor portion 46 is pressed to the sealing resin 44. This prevents the dummy terminal DT3 from coming out of the sealing resin 44.

Figure 4:
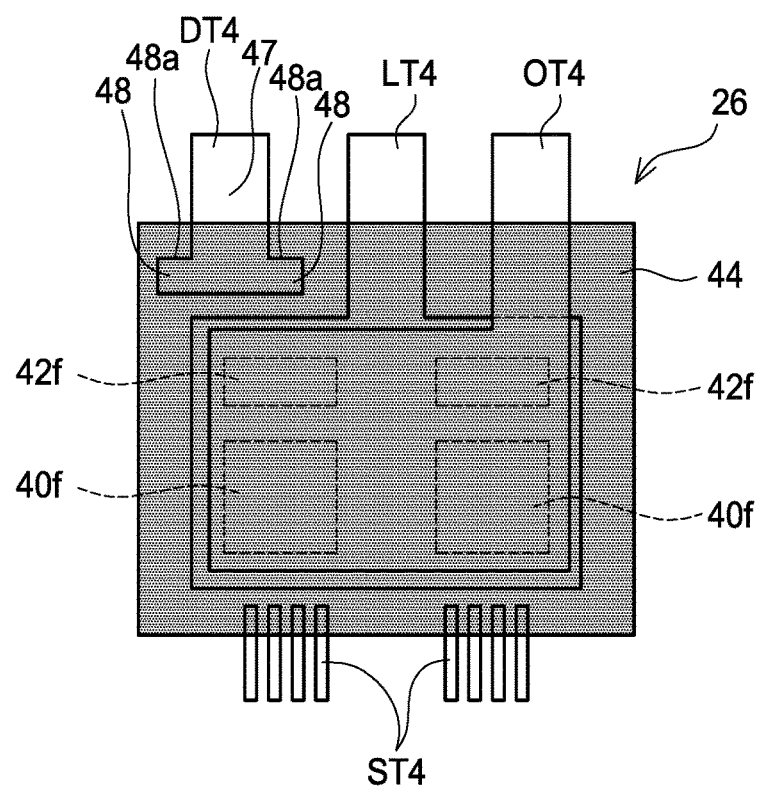
FIG. 4 is a plan view of a semiconductor device 26.

FIG. 4 shows each of the semiconductor devices 26. As shown in FIG. 4, each of the semiconductor devices 26 includes semiconductor chips 40f configuring the IGBT 40f and semiconductor chips 42f configuring the diode 42f. The IGBT 40f is configured by the two semiconductor chips 40f. For this reason, the IGBT 40f is higher in current capacity than the IGBTs 40a to 40d. Further, the diode 42f is configured by the two semiconductor chips 42f. For this reason, the diode 42f is higher in current capacity than the diodes 42a to 42d. Further, as mentioned above, each of the semiconductor devices 26 includes the low-potential terminal LT4 and the output terminal OT4. Furthermore, each of the semiconductor devices 26 includes a dummy terminal DT4, a plurality of signal terminals ST4, and the like. The low-potential terminal LT4 is connected to back surfaces of the two semiconductor chips 40f (i.e. the emitter of the IGBT 40f) and back surfaces of the two semiconductor chips 42f (i.e, an anode of the diode 42f). The output terminal OT4 is connected to front surfaces of the two semiconductor chips 40f (i.e. the collector of the IGBT 40f) and front surfaces of the two semiconductor chips 42f (i.e. a cathode of the diode 42f). The dummy terminal DT4 is connected to neither the two semiconductor chips 40f nor the two semiconductor chips 42f. The dummy terminal DT4 is spaced from each of the semiconductor chips 40f and 42f. Each of the signal terminals ST4 is connected to a gate of the IGBT 40f The semiconductor chips 40f and 42f and portions of the terminals LT4, OT4, and ST4 on which these semiconductor chips are mounted are covered with the sealing resin 44. Further, a base end of the dummy terminal DT4 is also covered with the sealing resin 44. The sealing resin 44 insulates the dummy terminal DT4 from the semiconductor chips 40f and 42f. The terminals DT4, LT4, OT4, and ST4 project from inside to outside of the sealing resin 44.

It should be noted that the dummy terminal DT4 includes a portion covered with the sealing resin 44 and serving as an anchor portion 48. The anchor portion 48 projects from a body portion 47 of the dummy terminal DT4 (i.e. a portion of the dummy terminal DT4 that extends from inside to outside of the sealing resin 44) along a direction orthogonal to the body portion 47 (i.e. a width direction of the body portion 47). For this reason, when the dummy terminal DT4 is pulled from the inside toward the outside, a surface 48a that is closer to the outside of the anchor portion 48 is pressed to the sealing resin 44. This prevents the dummy terminal DT4 from coming out of the sealing resin 44.

As shown in FIGS. 2 to 4, the semiconductor devices 20, 22, 24, and 26 are substantially identical in shape to each other. For this reason, when the semiconductor devices 20, 22, 24, and 26 are placed on top of each other, a plurality of terminals overlaps. That is, the terminals HT1, HT2, HT3, and DT4 overlap each other. The terminals LT1, LT2, DT3, and LT4 overlap each other. The terminals IT1, OT2, OT3, and OT4 overlap each other.

Figure 5:
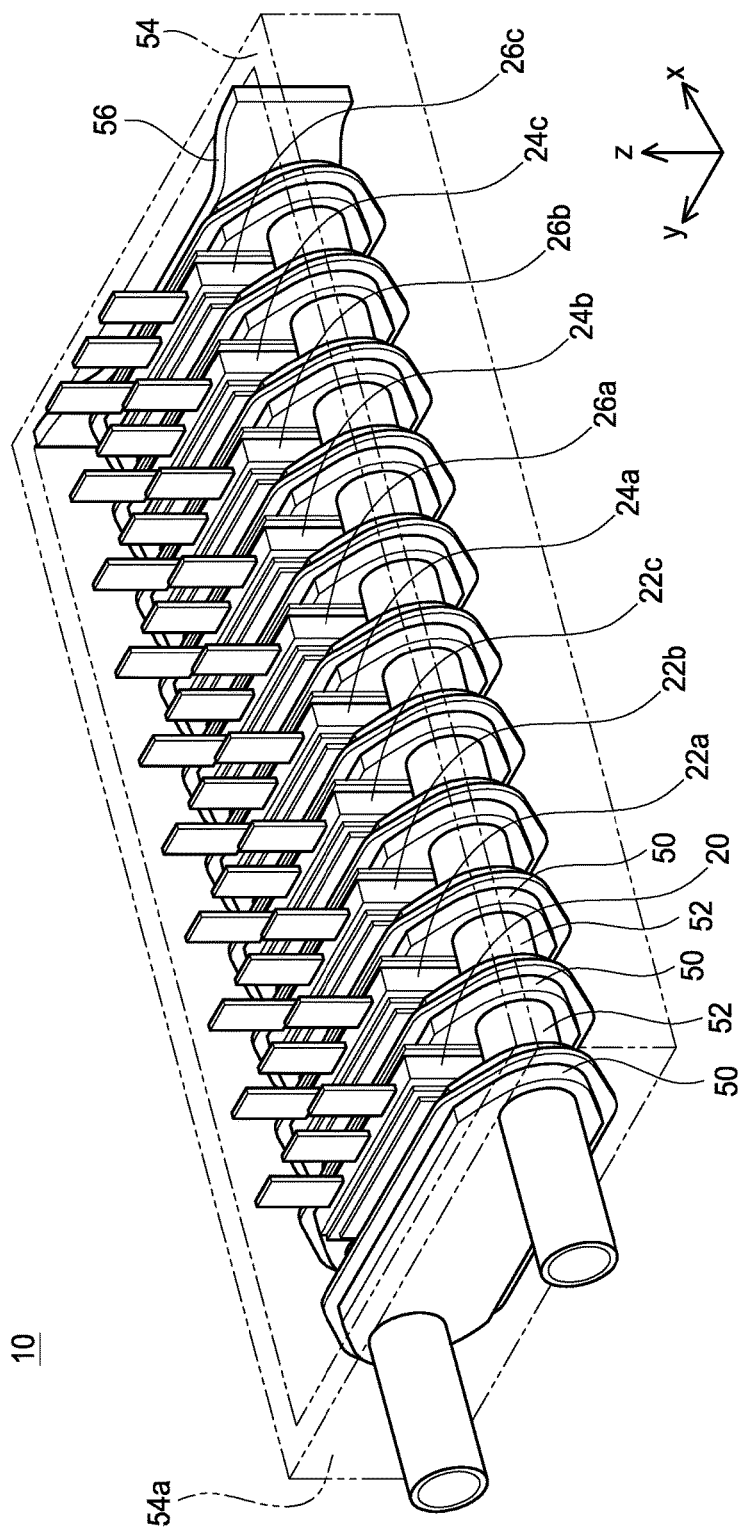
FIG. 5 is a perspective view of the semiconductor module 10.
Figure 6:
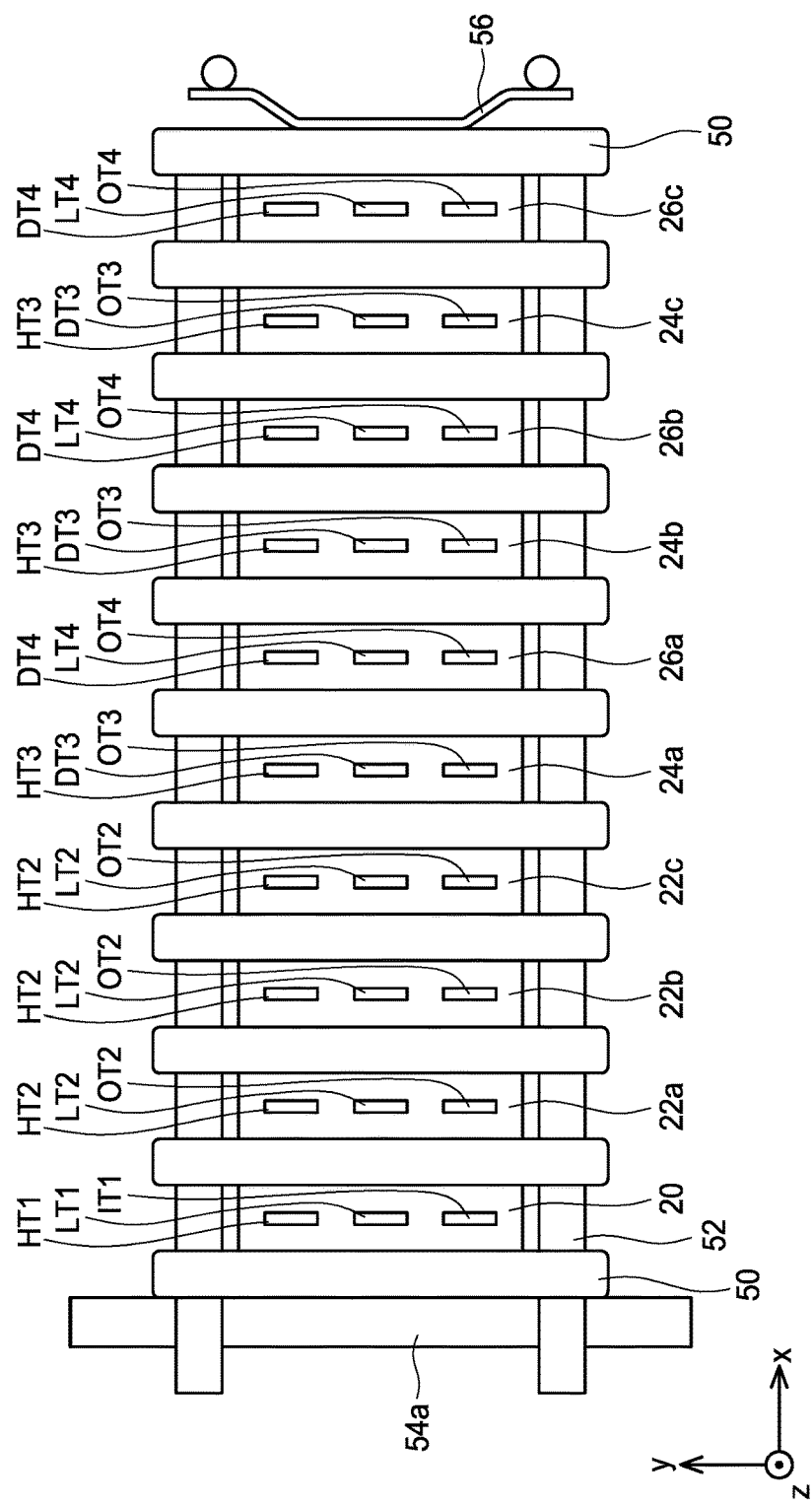
FIG. 6 is a plan view of the semiconductor module 10 as seen from a terminal side.

FIG. 5 is a perspective view of the semiconductor module 10. FIG. 6 is a plan view of an upper surface of the semiconductor module 10 of FIG. 5 (a surface on which the terminals HT, LT, and the like are located). As shown in FIGS. 5 and 6, the semiconductor module 10 has a structure in which the aforementioned semiconductor devices 20 to 26 and cooling plates 50 are alternately stacked. Therefore, one semiconductor device is sandwiched between two cooling plates 50. Each of the cooling plates 50 has an empty space inside. The cooling plates 50 are connected to each other by connecting pipes 52. A refrigerant flows through inside of the cooling plates 50 and the connecting pipes 52. This causes each of the semiconductor devices to be cooled. One of the cooling plates 50 that is positioned at one end of the semiconductor module 10 is in contact with a side wall 54a of a housing 54. The one of the cooling plates 50 that is positioned at the other end of the semiconductor module 10 is in contact with a plate spring 56. The plate spring 56 biases a stack of the semiconductor devices and the cooling plates 50 toward the side wall 54a. This brings the semiconductor devices and the cooling plates 50, which are adjacent to each other, into intimate contact with each other. The semiconductor devices are located so that surfaces thereof from which the terminals HT, LT, OT, or DT project serve as the upper surface of the semiconductor module 10. A stacking direction along which the semiconductor devices and the cooling plates 50 are stacked is referred to as "x direction". A direction along which the terminals HT, LT, OT, and DT project is referred to as "z direction". A direction orthogonal to the x direction and the z direction is referred to as "y direction".

Figure 7:
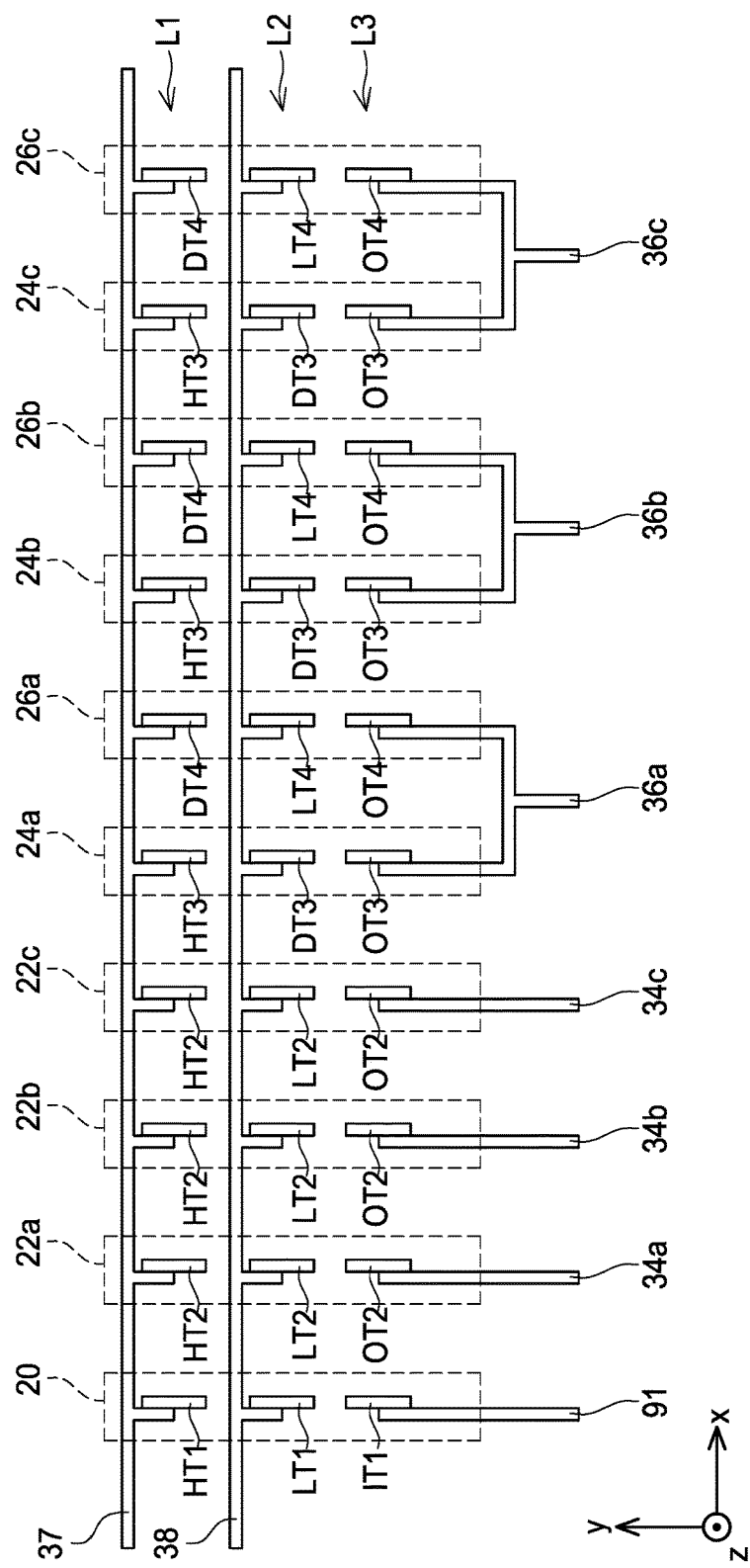
FIG. 7 is a diagram showing wires for the terminals of the semiconductor module 10.

As shown in FIGS. 5 and 6, the semiconductor devices are stacked so that the semiconductor device 20, 22a, 22b, 22c, 24a, 26a, 24b, 26b, 24c, and 26c are arranged in this order from the side wall 54a. FIG. 7 shows the terminals shown in FIG. 6 and the wires connected to these terminals. As shown in FIG. 7, the terminals HT1, HT2, HT3, and DT4 are arranged in a line along the x direction to form a terminal line L1. That is, the terminals HT1, HT2, HT3, and DT4 are arranged in such a linear fashion so as to overlap each other when viewed along the x direction. Further, the terminals LT1, LT2, DT3, and LT4 are arranged in a line along the x direction to form a terminal line L2. Further, the terminals IT1, OT2, OT3, and DT4 are arranged in a line along the x direction to form a terminal line L3. The terminal lines L1, L2, and L3 extend parallel to each other.

The high-potential bus bar 37 extends along the terminal line L1. The high-potential bus bar 37 is welded to each of the terminals forming the terminal line L1. The high-potential bus bar 37 is connected to the semiconductor chips in the semiconductor devices 20, 22, and 24 via the high-potential terminals HT1, HT2, and HT3 among the terminals forming the terminal line L1. On the other hand, as shown in FIG. 4, the dummy terminals DT4 of the semiconductor devices 26 are insulated from both the semiconductor chips 40f and 42f inside the sealing resin 44. Therefore, the high-potential bus bar 37 is connected to the dummy terminals DT4 but is not connected to the semiconductor chips 40f and 42f. For this reason, the dummy terminals DT4 do not electrically function. However, by thus connecting the high-potential bus bar 37 to each of the dummy terminals DT4, the high-potential bus bar 37 can be reinforced. This makes it possible to suppress vibration or the like of the high-potential bus bar 37.

The low-potential bus bar 38 extends along the terminal line L2. The low-potential bus bar 38 is welded to each of the terminals forming the terminal line L2. The low-potential bus bar 38 is connected to the semiconductor chips in the semiconductor devices 20, 22, and 26 via the low-potential terminals LT1, LT2, and LT4 among the terminals forming the terminal line L2. On the other hand, as shown in FIG. 3, the dummy terminals DT3 of the semiconductor devices 24 are insulated from both the semiconductor chips 40e and 42e inside the sealing resin 44. Therefore, the low-potential bus bar 38 is connected to the dummy terminals DT3 but is not connected to the semiconductor chips 40e and 42e. For this reason, the dummy terminals DT3 do not electrically function. However, by thus connecting the low-potential bus bar 38 to the dummy terminals DT3, the low-potential bus bar 38 can be reinforced. This makes it possible to suppress vibration or the like of the low-potential bus bar 38.

The input terminal IT1, which forms the terminal line L3, is connected to the power-supply wire 91. Further, each of the output terminals OT2, OT3, and OT4, which form the terminal line L3, is connected to a corresponding one of the output wires 34a, 34b, 34e, 36a, 36b, and 36c.

The circuit shown in FIG. 1 is configured by connecting each of the terminals to a corresponding one of the wires as shown in FIG. 7. By thus forming the terminal lines L1, L2, and L3 by arranging the terminals in a liner fashion and locating the bus bars along the terminal lines L1 and L2, it is possible to reduce a distance over which the wires have to be routed. This enables the reduction in size of the semiconductor module 10. Further, by arranging the terminals in this manner, operation of welding each of the terminals to a corresponding one of the wires can be efficiently performed along the terminal lines. This makes it possible to efficiently manufacture the semiconductor module 10.

Next, a method for manufacturing each of the semiconductor devices 20, 22, 24, and 26 is described.

Figure 8:
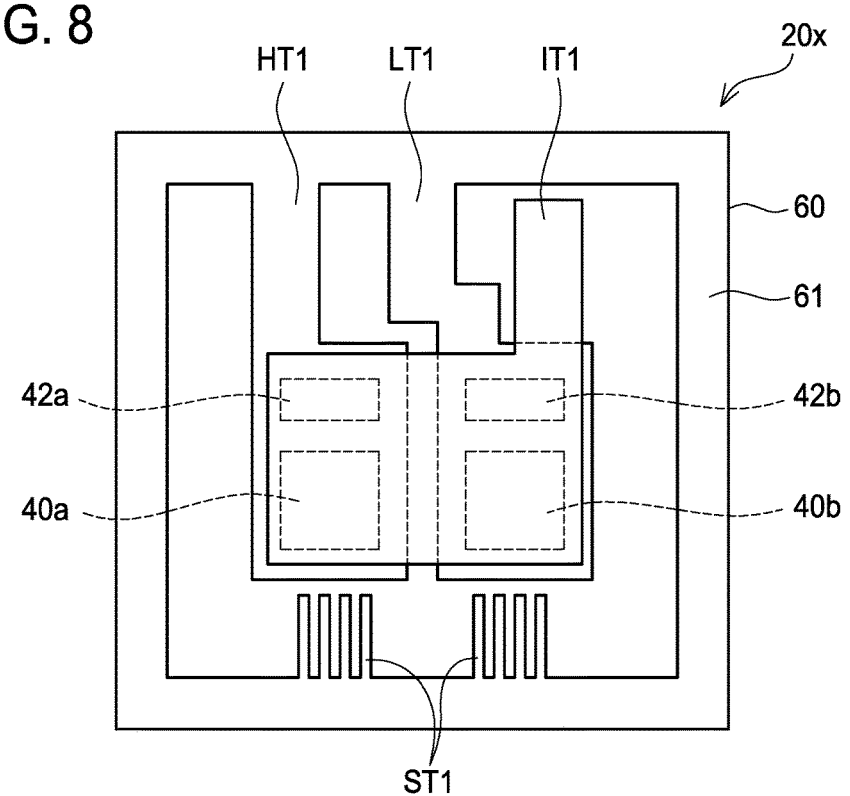
FIG. 8 is a plan view of a semi-product 20x.

First, manufacturing of the semiconductor device 20 shown in FIG. 2 will be described. In the manufacturing of the semiconductor device 20, a semi-product 20x shown in FIG. 8 is first manufactured. A lead frame 60 shown in FIG. 8 is a metal component in which the high-potential terminal HT1, the low-potential terminal LT1, and the signal terminals ST1 are connected to each other by a frame body 61. First, the semiconductor chips 40a and 42a are mounted on the high-potential terminal HT1 of the lead frame 60 by soldering. Further, the semiconductor chips 40b and 42b are mounted on the low-potential terminal LT1 of the lead frame 60 by soldering. Next, each of the signal terminals ST1 is connected to the semiconductor chips 40a and 40b by wire bonding. Then, the input terminal IT1 is soldered to the front surfaces of the semiconductor chips 40a, 40b, 42a, and 42b. Thus, the semi-product 20x shown in FIG. 8 is completed.

Figure 9:
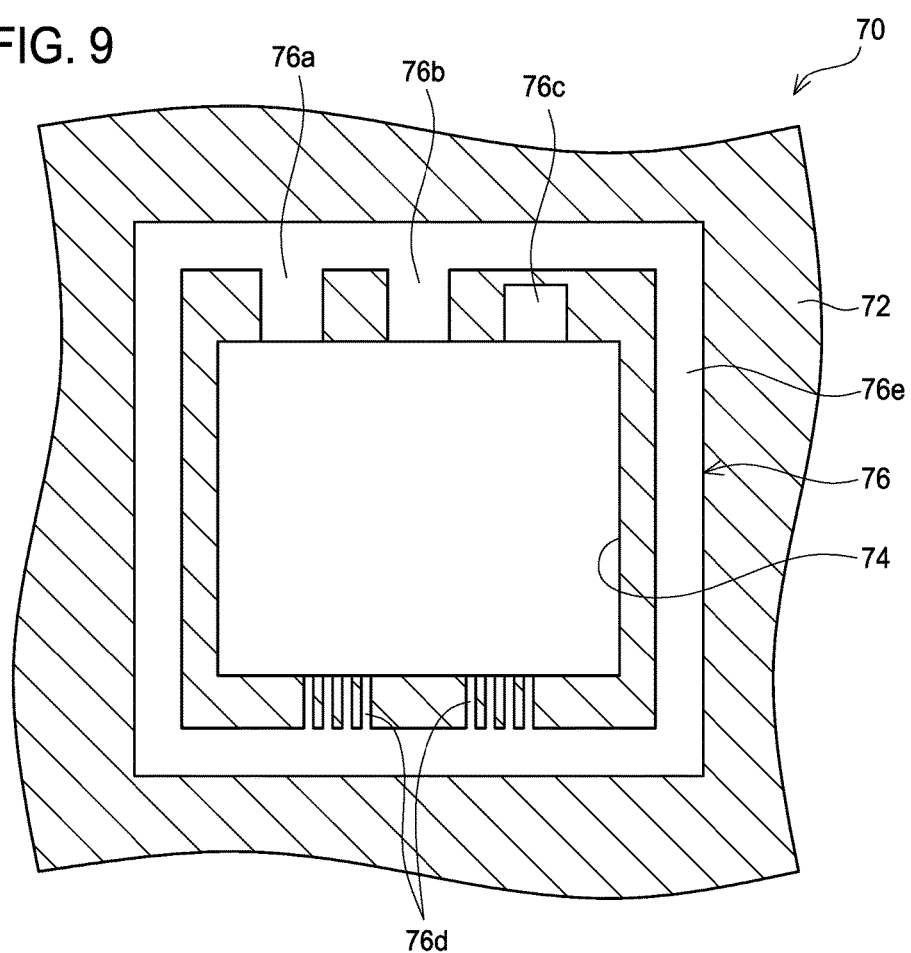
FIG. 9 is a plan view of a mold 70.

Next, injection molding is performed on the semi-product 20x using a mold 70 shown in FIG. 9. It should be noted that FIG. 9 shows one side mold of the mold 70 when the mold 70 is opened. A hatched area of FIG. 9 indicates a partition surface 72 (i.e. a surface that makes contact with the other side mold when the mold 70 is closed). As shown in FIG. 9, a cavity 74 and a groove 76 are provided in the partition surface 72 of the mold 70. The cavity 74 is a space into which resin is injected. The groove 76 is a groove by which the lead frame 60 is received. A depth of the groove 76 is shallower than a depth of the cavity 74. The groove 76 includes a high-potential terminal receiving groove 76a, a low-potential terminal receiving groove 76b, an input and output terminal receiving groove 76c, a signal terminal receiving grooves 76d, and an annular groove 76e. The grooves 76a, 76b, and 76d extend from the annular groove 76e to the cavity 74. The groove 76c extends to the cavity 74.

Figure 10:
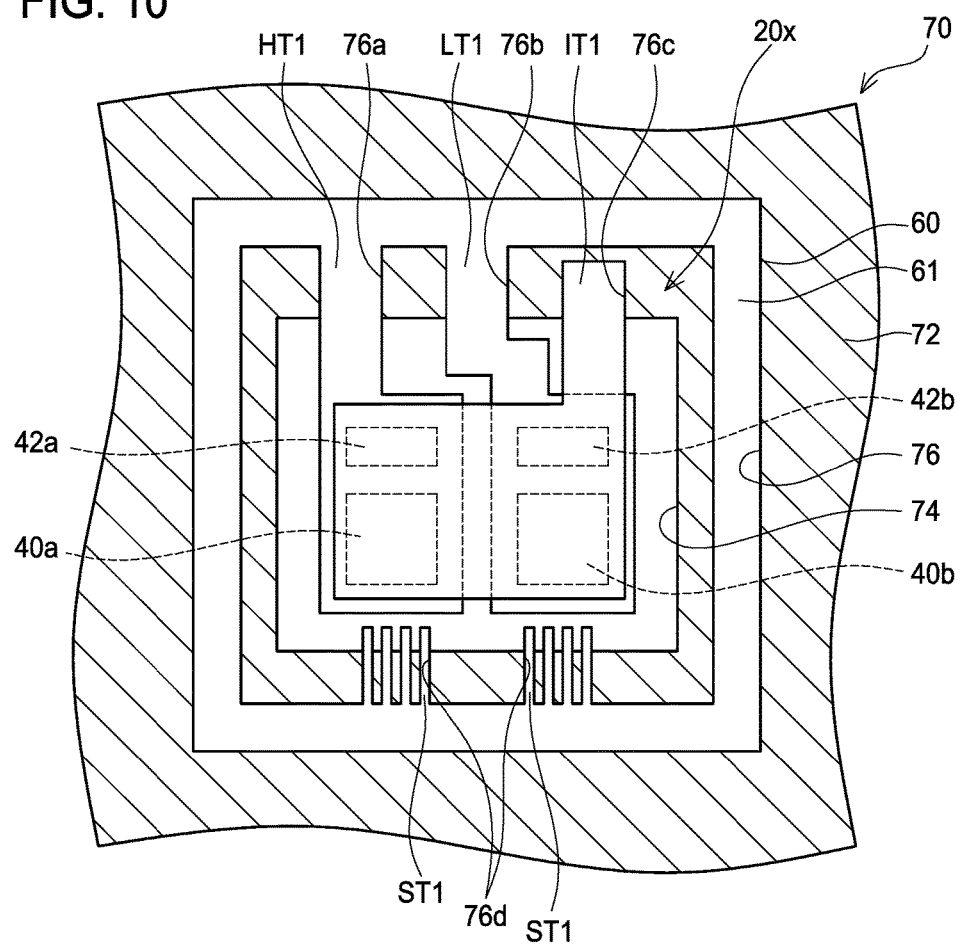
FIG. 10 is a plan view showing the semi-product 20x set into the mold 70.

When injection molding is performed on the semi-product 20x, the semi-product 20x is set to the mold 70 as shown in FIG. 10. The semiconductor chips 40a, 40b, 42a, and 42b are arranged in the cavity 74. A portion of the lead frame 60 that is positioned outside the cavity 74 is arranged in the groove 76. More specifically, the high-potential terminal HT1 is arranged in the high-potential terminal receiving groove 76a. The low-potential terminal LT1 is arranged in the low-potential terminal receiving groove 76b. The input terminal IT1 is arranged in the input and output terminal receiving groove 76c. The signal terminals ST1 are arranged in the signal terminal receiving grooves 76d. Each of the terminals HT1, LT1, IT1 and ST1 are brought into intimate contact with an inner wall of a corresponding one of the terminal receiving grooves 76a to 76d, without any gap between the terminals and corresponding grooves. Once the semi-product 20x is set to the mold 70 as shown in FIG. 10, the mold 70 is closed and the cavity 74 is filled with molten resin. At this occasion, the molten resin does not flow into the terminal receiving grooves 76a to 76d, as each of the terminals HT1, LT1, IT1 and ST1 has been an intimate contact with the inner wall of the corresponding one of the terminal receiving grooves 76a to 76d. After that, the mold 70 is cooled to cure the molten resin, thereby forming the sealing resin 44 (FIG. 2) with which the semiconductor chips 40a, 40b, 42a, and 42b are sealed. After the molten resin cures, the molded product is taken out of the mold 70. After that, the lead frame 60 is cut so that the frame body 61 is cut off from the terminals HT1, LT1, IT1, and ST1. This causes the terminals HT1, LT1, and ST1 to be separated from each other. Through these steps, the semiconductor device 20 shown in FIG. 2 is completed.

A description of manufacturing of each of the semiconductor devices 22 is omitted, as it is substantially the same as the manufacturing of the semiconductor device 20.

Figure 11:
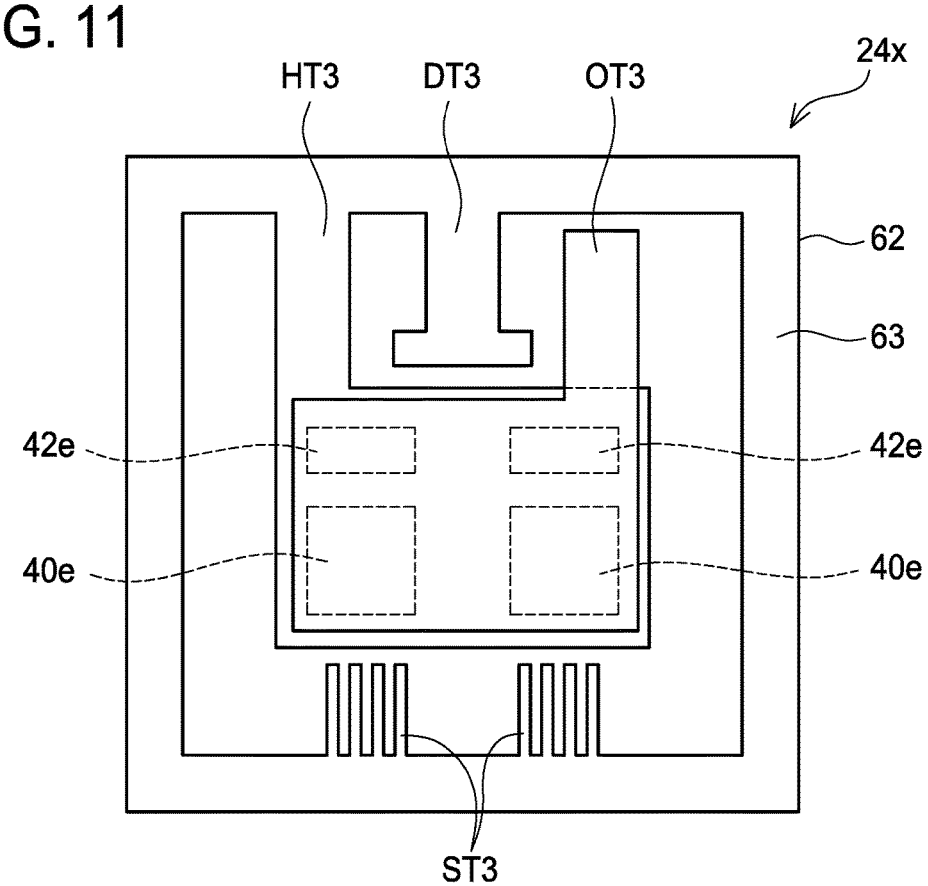
FIG. 11 is a plan view of a semi-product 24x.

Next, manufacturing of each semiconductor device 24 shown in FIG. 3 will be described. In the manufacturing of the semiconductor device 24, a semi-product 24x shown in FIG. 11 is first manufactured. A lead frame 62 shown in FIG. 11 is a metal component in which the high-potential terminal HT3, the dummy terminal DT3, and the signal terminals ST3 are connected to each other by a frame body 63. First, the semiconductor chips 40c and 42e are mounted on the high-potential terminal HT3 of the lead frame 62 by soldering. It should be noted that the dummy terminal DT3 is spaced from the high-potential terminal HT3. That is, the dummy terminal. DT3 is spaced from the semiconductor chips 40e and 42e. Next, the signal terminals ST3 are connected to the semiconductor chips 40e by wire bonding. Then, the output terminal OT3 is soldered to the front surfaces of the semiconductor chips 40e and 42e. Thus, the semi-product 24x shown in FIG. 11 is completed. It should be noted that the terminals HT3, DT3, and OT3 of the semi-product 24x are equal in width, thickness, pitch, and position to the terminals HT1, LT1, and IT1 of the semi-product 20x shown in FIG. 8.

Next, injection molding is performed on the semi-product 24x using the mold 70 shown in FIG. 9. First, the semi-product 24x is set to the mold 70. The semiconductor chips 40e and 42e are arranged in the cavity 74. The high-potential terminal HT3 is arranged in the high-potential terminal receiving groove 76a. The dummy terminal DT3 is arranged in the low-potential terminal receiving groove 76b. The output terminal OT3 is arranged in the input and output terminal receiving groove 76c. The signal terminals ST3 are arranged in the signal terminal receiving grooves 76d. Each of the terminals HT3, DT3, OT3 and ST3 are brought into intimate contact with an inner wall of a corresponding one of the terminal receiving grooves 76a to 76d, without any gap between the terminals and corresponding grooves. After that, the mold 70 is closed and injection molding is performed. Since each of the terminals HT3, DT3, OT3 and ST3 has been in intimate contact with the inner wall of the corresponding one of the terminal receiving grooves 76a to 76d, the molten resin does not flow into the terminal receiving grooves 76a to 76d. The performing of injection molding forms the sealing resin 44 (FIG. 3) with which the semiconductor chips 40e and 42e are sealed. After that, the lead frame 62 is cut so that the terminals HT3, DT3, and ST3 are separated from each other. Through these steps, the semiconductor device 24 shown in FIG. 3 is completed. As just described, the semiconductor device 24 can be manufactured using the same mold 70 as that which is used in manufacturing the semiconductor devices 20 and 22.

Figure 12:
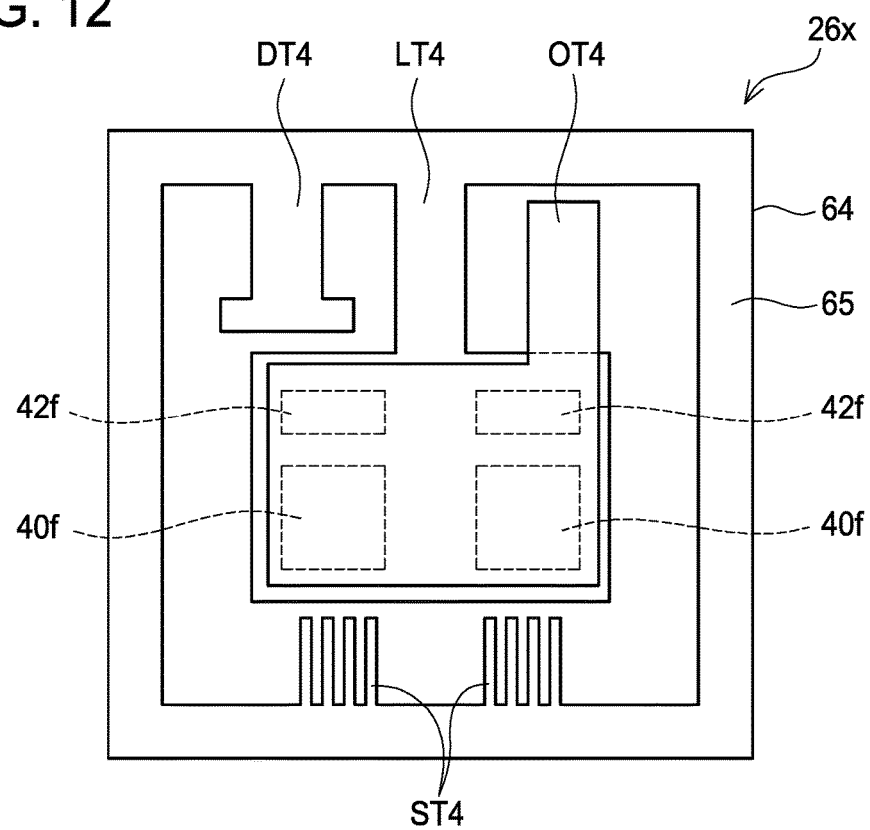
FIG. 12 is a plan view of a semi-product 26x.

Next, manufacturing of the semiconductor device 26 shown in FIG. 4 will be described. In the manufacturing of the semiconductor device 26, a semi-product 26x shown in FIG. 12 is first manufactured. A lead frame 64 shown in FIG. 12 is a metal component in which the dummy terminal DT4, the low-potential terminal LT4, and the signal terminals ST4 are connected to each other by a frame body 65. First, the semiconductor chips 40f and 42f are mounted on the low-potential terminal LT4 of the lead frame 64 by soldering. It should be noted that the dummy terminal DT4 is spaced from the low-potential terminal LT4. That is, the dummy terminal DT4 is spaced from the semiconductor chips 40f and 42f. Next, the signal terminals ST4 are connected to the semiconductor chips 40f by wire bonding. Then, the output terminal OT4 is soldered to the front surfaces of the semiconductor chips 40f and 42f. Thus, the semi-product 26x shown in FIG. 12 is completed. It should be noted that the terminals DT4, and OT4 of the semi-product 26x are equal in width, thickness, pitch, and position to the terminals HT1, LT1, and IT1 of the semi-product 20x shown in FIG. 8.

Next, injection molding is performed on the semi-product 26x using the mold 70 shown in FIG. 9. First, the semi-product 26x is set to the mold 70. The semiconductor chips 40f and 42f are arranged in the cavity 74. The dummy terminal DT4 is arranged in the high-potential terminal receiving groove 76a. The low-potential terminal LT4 is arranged in the low-potential terminal receiving groove 76b. The output terminal OT4 is arranged in the input and output terminal receiving groove 76c. The signal terminals ST4 are arranged in the signal terminal receiving grooves 76d. Each of the terminals DT4, LT4, OT4, and ST4 is brought into intimate contact with an inner wall of a corresponding one of the terminal receiving grooves 76a to 76d without any gap between the terminals and corresponding grooves. After that, the mold 70 is closed and injection molding is performed. Since each of the terminals DT4, LT4, OT4, and ST4 has been in intimate contact with the inner wall of the corresponding one of the terminal receiving grooves 76a to 76d, the molten resin does not flow into the terminal receiving grooves 76a to 76d. The performing of injection molding forms the sealing resin 44 (FIG. 4) with which the semiconductor chips 40f and 42f are sealed. After that, the lead frame 64 is cut so that the terminals DT4, LT4, and ST4 are separated from each other. Through these steps, the semiconductor device 26 as shown in FIG. 4 is completed. As just described, the semiconductor device 26 can be manufactured using the same mold 70 as that which is used in manufacturing the semiconductor devices 20 and 22.

As described above, the semiconductor module 10 according to Embodiment 1 includes the semiconductor devices 20, 22, 24, and 26. Each of the semiconductor devices 20 and 22 includes a high-potential terminal HT, a low-potential terminal LT, and an input or output terminal IT or OT. That is, each of the semiconductor devices 20 and 22 is a three-terminal semiconductor device including three terminals through which a main current flows. Each of the semiconductor devices 24 includes a high-potential terminal HT and an output terminal OT. Each of the semiconductor devices 24 includes a dummy terminal DT instead of including a low-potential terminal LT. That is, each of the semiconductor devices 24 is a two-terminal semiconductor device including two terminals through which a main current flows. Each of the semiconductor devices 26 includes a low-potential terminal LT and an output terminal OT. Each of the semiconductor devices 26 includes a dummy terminal DT instead of including a high-potential terminal HT. That is, each of the semiconductor devices 26 is a two-terminal semiconductor device including two terminals through which a main current flows. The semiconductor devices 20, 22, 24, and 26 are stacked such that the high-potential terminals HT are arranged in a line, the low-potential terminals LT are arranged in a line, and the input and output terminals IT and OT are arranged in a line. As shown in FIG. 7, the semiconductor devices 24, which include no low-potential terminals LT, have the dummy terminals DT3 arranged in positions on the terminal line L2 for the low-potential terminals LT. Further, the semiconductor devices 26, which include no high-potential terminals HT, have the dummy terminals DT4 arranged in positions on the terminal line L1 for the high-potential terminals HT. By thus arranging the dummy terminals DT in the positions of lacking terminals, the semiconductor devices can have shapes substantially identical to each other when viewed along the stacking direction (x direction). That is, the semiconductor devices can be made substantially equal in number of terminals, pitch between terminals, and width of each terminal to each other when viewed along the stacking direction. For this reason, all of the semiconductor devices 20, 22, 24, and 26 fit into the terminal receiving grooves of the mold 70. This makes it possible to manufacture the semiconductor devices 20, 22, 24, and 26 using the common mold 70. Since it is possible to use the common mold 70, an efficiency of manufacturing of the semiconductor module 10 is dramatically improved. The following will gives more detailed descriptions.

FIG. 9 shows an area of the mold 70 that corresponds to one cavity 74. However, in actuality, the mold 70 includes a large number of (e.g. 10) cavities 74, and injection molding is simultaneously performed on ten semiconductor devices. For this reason, an weight of the mold 70 is for example approximately 500 kg. Further, during injection molding, the mold 70 is heated to 120 to 200° C. It usually takes 3 to 6 hours to heat such an extremely heavy mold 70 from room temperature to the above temperatures. This is because heating in short period of time causes the temperature non-uniformity inside the mold 70 and thus invites deterioration in quality. Changing molds for each semiconductor device to be manufactured requires time, as it is necessary to carefully perform the operation of changing heavy molds. Further, heating a newly set mold from room temperature to the above temperatures requires time. For this reason, the operation of changing molds requires an extremely long time. Contrary to this, the semiconductor module 10 enables the use of the common mold 70 in manufacturing the semiconductor devices 20, 22, 24, and 26 that are to be used in the semiconductor module 10. This makes it unnecessary to perform the operation of changing molds. Therefore, the semiconductor module 10 can be extremely efficiently manufactured.

As described above, this semiconductor module 10 can be efficiently manufactured.

Embodiment 2

Figure 13:
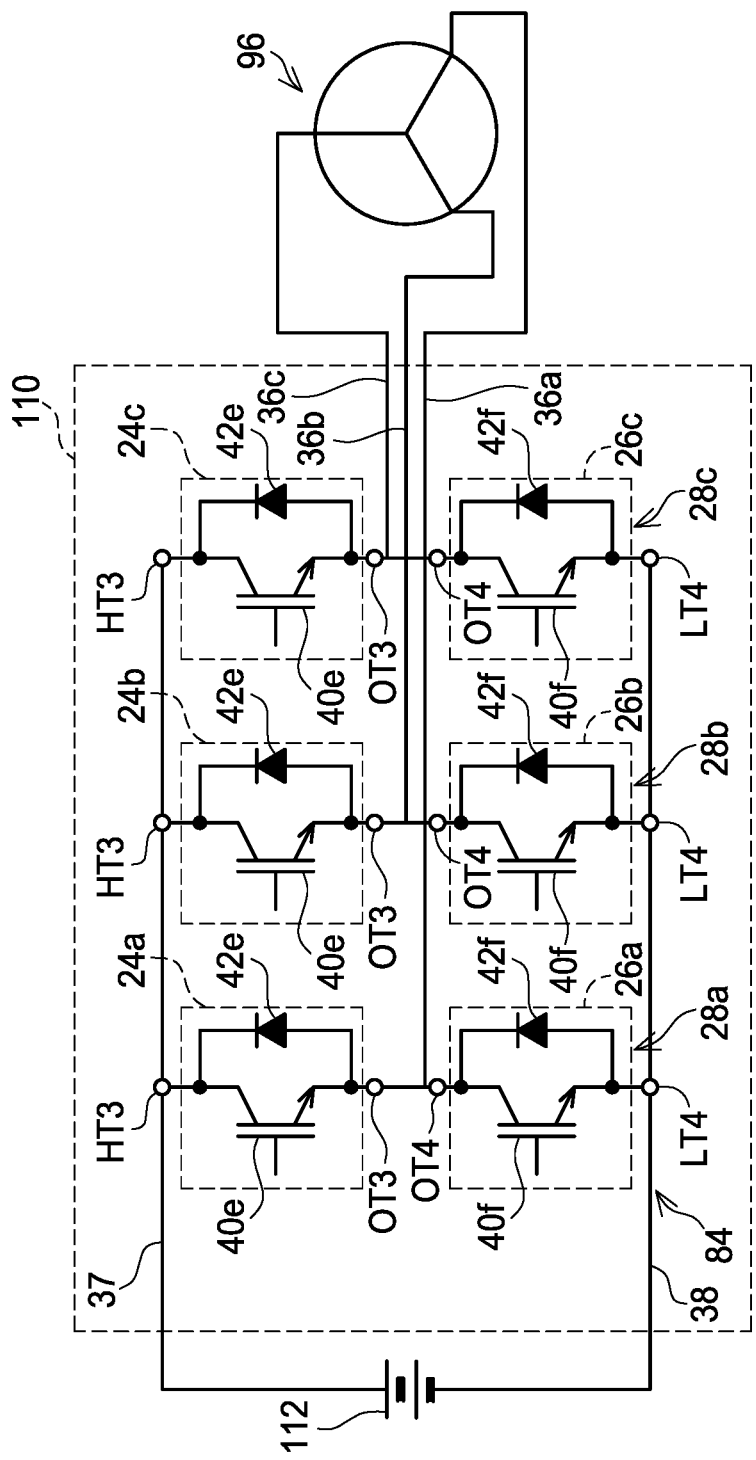
FIG. 13 is a circuit diagram of a semiconductor module 110.

FIG. 13 shows a circuit configuration of a semiconductor module 110 according to Embodiment 2. This circuit configuration is identical to that of the inverter 84 shown in FIG. 1. The semiconductor module 110 converts an output voltage of a direct-current power source 12 into a three-phase alternating-current voltage and supplies the three-phase alternating-current voltage to a motor 96.

Figure 14:
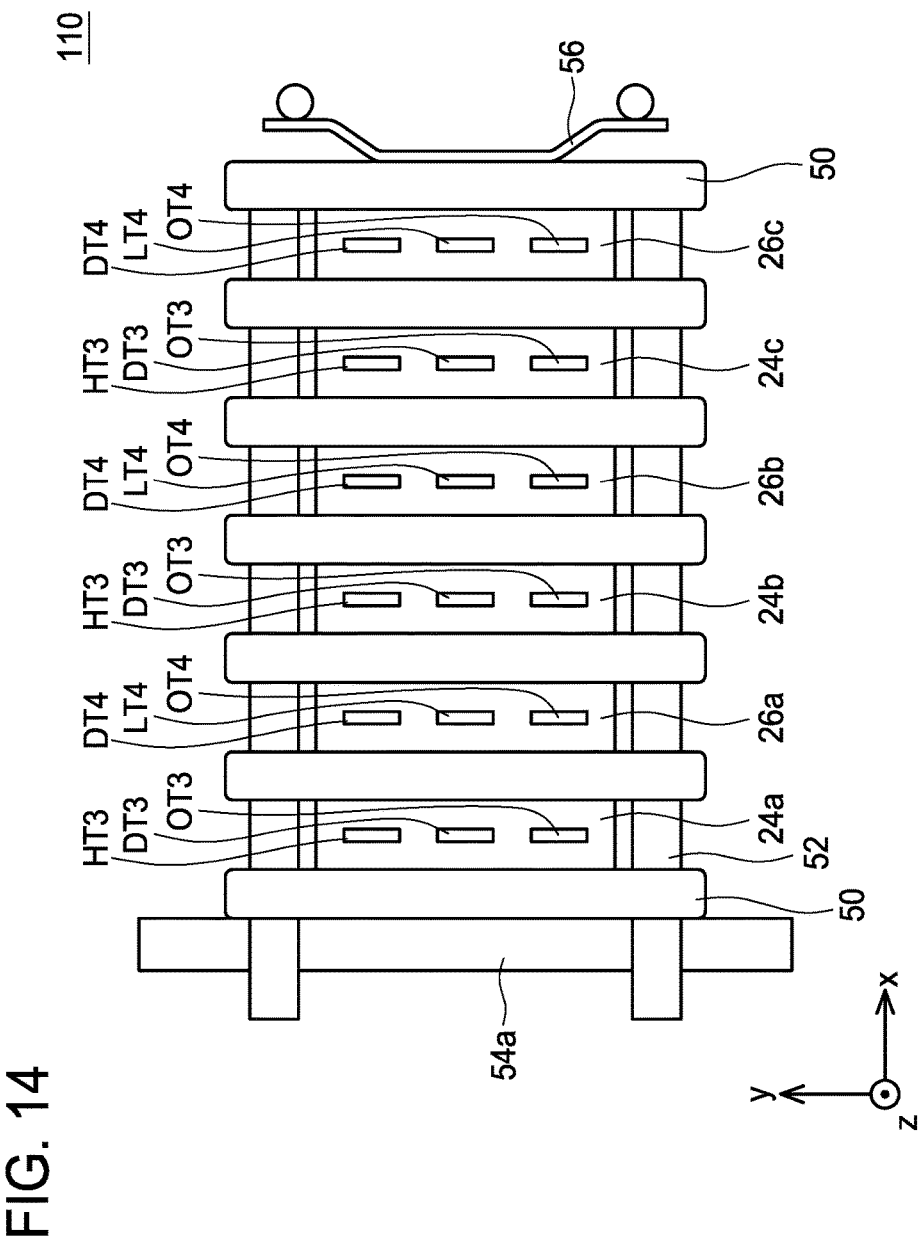
FIG. 14 is a plan view of the semiconductor module 110 as seen from a terminal side.
Figure 15:
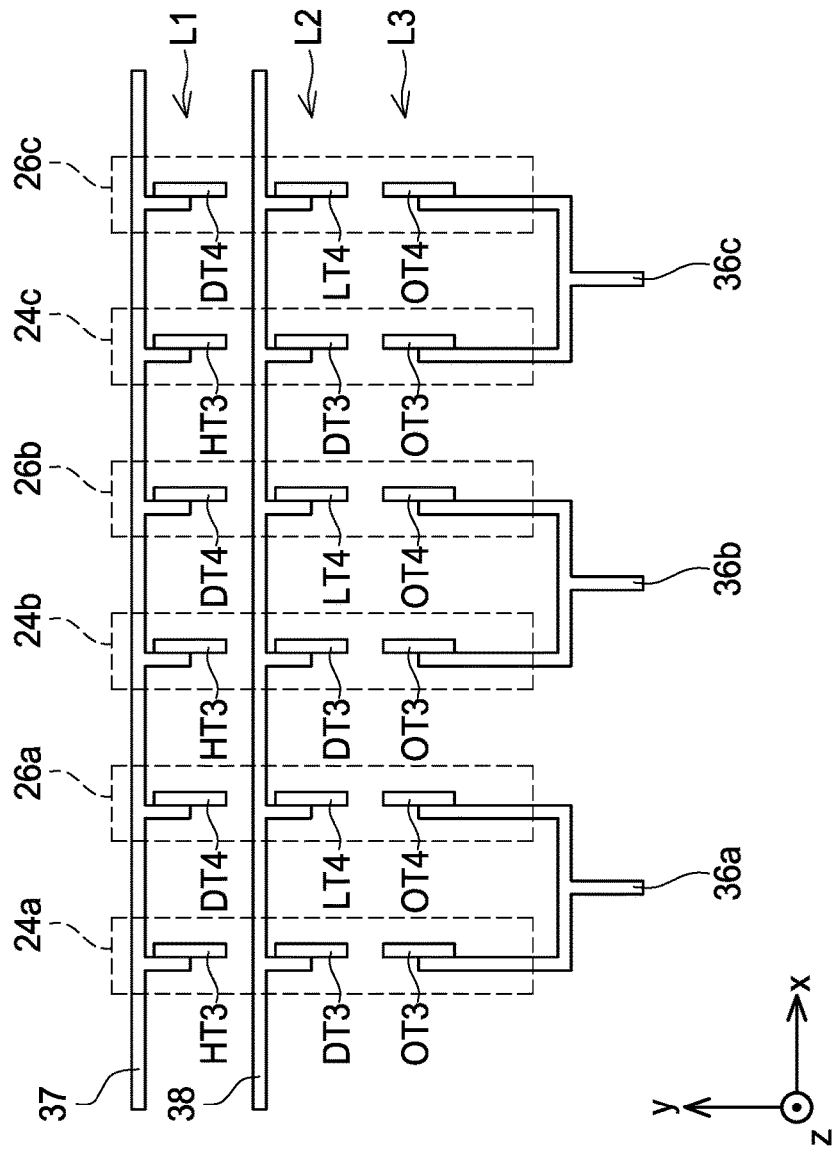
FIG. 15 is a diagram showing wires for the terminals of the semiconductor module 110.

As shown in FIGS. 14 and 15, the semiconductor module 110 has a structure in which semiconductor devices 24 and 26 and cooling plates 50 are stacked. The semiconductor devices 24a, 26a, 24b, 26b, 24c, and 26c are arranged in this order from a side wall 54a. FIG. 15 shows the same wire structure as that shown in FIG. 7 with respect to the semiconductor devices 24 and 26.

Each of the semiconductor devices 24 is a two-terminal semiconductor device in which a current flows between the high-potential terminal HT3 and the output terminal OT3. Each of the semiconductor devices 26 is a two-terminal semiconductor device in which a current flows between the low-potential terminal LT4 and the output terminal OT4. That is, the semiconductor module 110 is configured by two types of two-terminal semiconductor devices. Further, as mentioned above, the semiconductor devices 24 and the semiconductor device 26 can be manufactured using the common mold 70. Therefore, the semiconductor module 110 can be efficiently manufactured. Thus, even in a case where the semiconductor module 110 is configured by two types of two-terminal semiconductor devices, the semiconductor module 110 can be efficiently manufactured by providing dummy terminals in place of lacking terminals.

Figure 16:
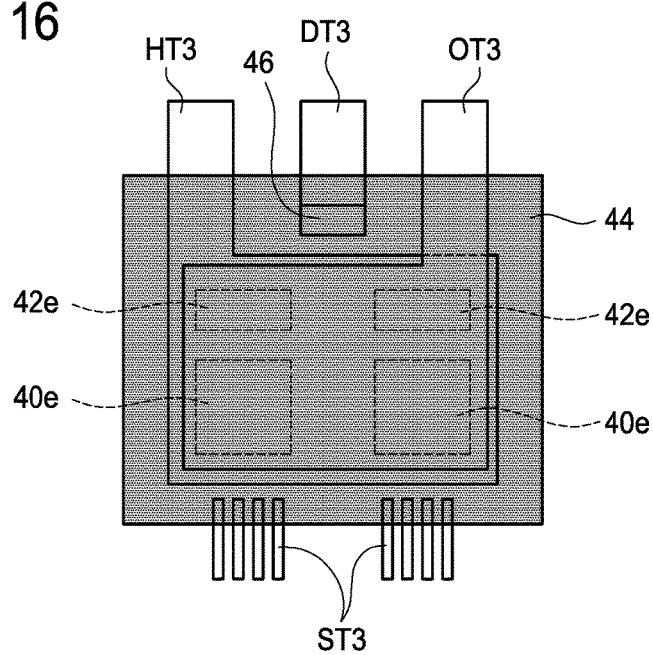
FIG. 16 is a plan view showing a first modification of an anchor portion 46.
Figure 17:
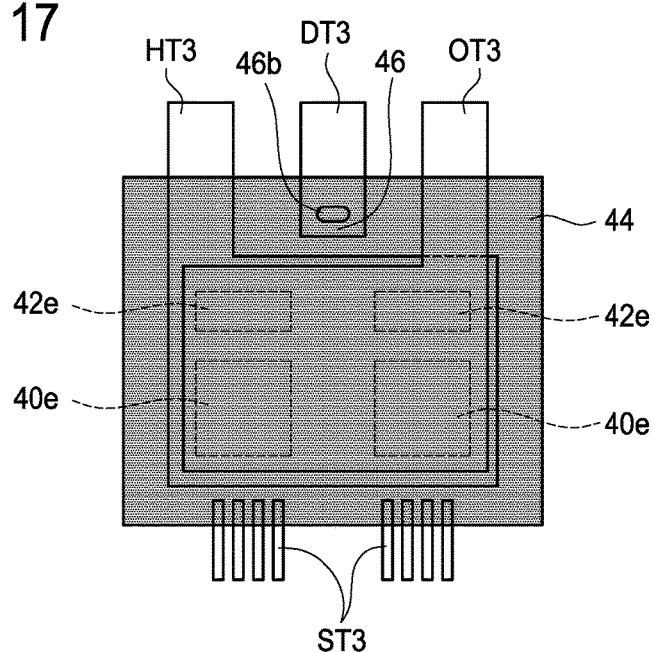
FIG. 17 is a plan view showing a second modification of the anchor portion 46.

In each of Embodiments 1 and 2 described above, the dummy terminals DT3 and DT4 include the anchor portions 46 and 48, respectively. The anchor portions 46 and 48 extend along the width directions of the dummy terminals DT3 and DT4, respectively. However, another shape may be employed as the shape of an anchor portion. For example, as shown in FIG. 16, a dummy terminal DT3 may be bent in a thickness direction, and the bent portion may configure an anchor portion 46. Alternatively, as shown in FIG. 17, a dummy terminal DT3 may have a through-hole 46b formed therein, and the sealing resin 44 may fill the through-hole 46b. Each of the structures shown in FIGS. 16 and 17, too, makes it possible to prevent the dummy terminal DT3 from coming out of the sealing resin 44. Each of the structures shown in FIGS. 16 and 17 may be employed as an anchor portion 48 of a dummy terminal DT4. Alternatively, in a case where it is difficult for dummy terminals to come out of the sealing resin 44, no anchor portions 46 and 48 may be formed.

Further, in each of the embodiments described above, four semiconductor chips are arranged inside the sealing resin 44. However, since the provision of dummy terminals causes an increase in size of the semiconductor device, a larger number of semiconductor chips may be arranged inside the sealing resin 44. This makes it possible to improve the current capacity of the semiconductor device.

The following will explain a relationship between the components of each of the embodiments and the components of the claims.

In Embodiment 1, the semiconductor devices 20 and 22 may be considered as an example of the first semiconductor devices of the claims, and the semiconductor devices 24 may be considered as an example of the second semiconductor devices of the claims. In this case, the input and output terminals IT1 and OT2 are examples of the first terminals of the claims. The high-potential terminals HT1 and HT2 are examples of the second terminals of the claims. The low-potential terminals LT1 and LT2 are examples of the third terminals of the claims. The output terminals OT3 are examples of the fourth terminals of the claims. The high-potential terminals HT3 are examples of the fifth terminals of the claims. The dummy terminals DT3 are examples of the sixth terminals of the claims.

Alternatively, in Embodiment 1, the semiconductor devices 20 and 22 may be considered as an example of the first semiconductor devices of the claims, and the semiconductor devices 26 may be considered as an example of the second semiconductor devices of the claims. In this case, the input and output terminals IT1 and OT2 are examples of the first terminals of the claims. The low-potential terminals LT1 and LT2 are examples of the second terminals of the claims. The high-potential terminals HT1 and HT2 are examples of the third terminals of the claims. The output terminals OT4 are examples of the fourth terminals of the claims. The low-potential terminals LT4 are examples of the fifth terminals of the claims. The dummy terminals DT4 are examples of the sixth terminals of the claims.

Alternatively, in Embodiments 1 and 2, the semiconductor devices 24 may be considered as an example of the first semiconductor devices of the claims, and the semiconductor devices 26 may be considered as an example of the second semiconductor devices of the claims. In this case, the output terminals OT3 are examples of the first terminals of the claims. The dummy terminals DT3 are examples of the second terminals of the claims. The high-potential terminals HT3 are examples of the third terminals of the claims. The output terminals OT4 are examples of the fourth terminals of the claims. The low-potential terminals LT4 are examples of the fifth terminals of the claims. The dummy terminals DT4 are examples of the sixth terminals of the claims.

The following will list some of configurations of a semiconductor module disclosed herein. The configurations are useful independently of each other.

A semiconductor module disclosed herein may comprise: a plurality of first semiconductor devices; a plurality of second semiconductor devices; a first wire; and a second wire. Each of the first semiconductor devices comprises: first sealing resin; first, second, and third terminals each of which projects from inside to outside of the first sealing resin; a first semiconductor chip located inside the first sealing resin and connected to at least the first and third terminals. Each of the second semiconductor devices comprises: second sealing resin; fourth, fifth, and sixth terminals each of which projects from inside to outside of the second sealing resin; a second semiconductor chip located inside the second sealing resin, connected to the fourth and fifth terminals, and not connected to the sixth terminal. The first semiconductor devices and the second semiconductor devices are stacked along a stacking direction. The first terminals and the fourth terminals are arranged in a line along the stacking direction. The second terminals and the fifth terminals are arranged in a line along the stacking direction. The third terminals and the sixth terminals are arranged in a line along the stacking direction. The first wire extends along the line of the second terminals and the fifth terminals, and is connected to the fifth terminals. The second wire extends along the line of the third terminals and the sixth terminals, and is connected to the third terminals.

In one aspect of the present disclosure, a portion of the each sixth terminal that is located inside the second sealing resin may comprise an anchor portion configured to be pressed to the second sealing resin when the sixth terminal is pulled from the inside toward the outside of the second sealing resin This configuration makes it possible to prevent the sixth terminals from coming out of the second sealing resin.

In another aspect of the present disclosure, the second wire may be connected to the sixth terminals.

This configuration allows the second wire to be reinforced by the sixth terminals. Further, the second wire and the second semiconductor chip are not connected even if the second wire is connected to the sixth terminals, as the sixth terminals are not connected to the second semiconductor chip.

In another aspect of the present disclosure, the second wire is not be connected to the sixth terminals.

This configuration makes it possible to efficiently manufacture the semiconductor module, as the second wire has fewer connecting points.

In another aspect of the present disclosure, a semiconductor device may comprise: a semiconductor chip; sealing resin sealing the semiconductor chip; a first valid terminal projecting from inside to outside of the sealing resin and connected to the semiconductor chip inside the sealing resin; a second valid terminal projecting from the inside to the outside of the sealing resin and connected to the semiconductor chip inside the sealing resin; and a dummy terminal projecting from the inside to the outside of the sealing resin and not connected to the semiconductor chip inside the sealing resin.

It should be noted that the semiconductor device may include a plurality of the semiconductor chips inside the sealing resin. In this case, the first valid terminal may only be connected at least one of the semiconductor chips inside the sealing resin. Further, the second valid terminal may only be connected at least one of the semiconductor chips inside the sealing resin. Further, the dummy terminal is not connected to any of the semiconductor chips inside the sealing resin.

In another aspect of the present disclosure, a portion of the dummy terminal located inside the sealing resin may comprise an anchor portion configured to be pressed to the sealing resin when the dummy terminal is pulled from the inside toward the outside of the sealing resin In a method disclosed herein as an example, a first semiconductor device and a second semiconductor device are manufactured using a common mold. The method may comprise: manufacturing the first semiconductor device from a first semi-product; and manufacturing the second semiconductor device from a second semi-product. The mold comprises a cavity and first, second, and third receiving grooves each of which is connected to the cavity. The first semi-product comprises: a first semiconductor chip; first and third terminals each of which is connected to the first semiconductor chip; and a second terminal. The second semi-product comprises: a second semiconductor chip;

fourth and fifth terminals each of which is connected to the second semiconductor chip; and a sixth terminal spaced from the second semiconductor chip. The manufacturing of the first semiconductor device comprises: setting the first semi-product to the mold so that the first semiconductor chip is located in the cavity, the first terminal is located in the first receiving groove, the second terminal is located in the second receiving groove, and the third terminal is located in the third receiving groove; and sealing the first semiconductor chip with sealing resin using the mold after the setting of the first semi-product. The manufacturing of the second semiconductor device comprises: setting the second semi-product to the mold so that the second semiconductor chip is located in the cavity, the fourth terminal is located in the first receiving groove, the fifth terminal is located in the second receiving groove, and the sixth terminal is located in the third receiving groove; and sealing the second semiconductor chip with sealing resin using the mold after the setting of the second semi-product.

It should be noted that the first semi-product may include a plurality of the first semiconductor chips. In this case, the first terminal may only be connected to at least one of the first semiconductor chips. Further, the third terminal may only be connected to at least one of the first semiconductor chips. Further, the second terminal may or may not be connected to a first semiconductor chip (i.e. may be spaced from a first semiconductor chip). In a case where the first semi-product includes a plurality of the first semiconductor chips, saying that the second terminal is not connected to a first semiconductor chip means that the second terminal is not connected to any of the first semiconductor chips (i.e. that the second terminal is spaced from all of the first semiconductor chips).

Further, the second semi-product may include a plurality of the second semiconductor chips. In this case, the fourth terminal may only be connected to at least one of the second semiconductor chips. Further, the fifth terminal may only be connected to at least one of the second semiconductor chips. Further, the sixth terminal is spaced from all of the second semiconductor chips.

This method makes it possible to manufacture a first semiconductor device and a second semiconductor device using a common mold.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor module, comprising:
   a first wire;
   a second wire;
   a plurality of first semiconductor devices, each one of the first semiconductor devices comprising:
     first sealing resin;
     first, second, and third terminals, each of which projects from inside to outside of the first sealing resin; and
     a first semiconductor chip located inside the first sealing resin and connected to at least the first and third terminals; and
   a plurality of second semiconductor devices, each one of the second semiconductor devices comprising:
     second sealing resin;
     fourth, fifth, and sixth terminals, each of which projects from inside to outside of the second sealing resin; and
     a second semiconductor chip located inside the second sealing resin, connected to the fourth and fifth terminals, and not connected to the sixth terminal,
   wherein the first semiconductor devices and the second semiconductor devices are stacked along a stacking direction,
   the first terminals and the fourth terminals are arranged in a line along the stacking direction,
   the second terminals and the fifth terminals are arranged in a line along the stacking direction,
   the third terminals and the sixth terminals are arranged in a line along the stacking direction,
   the first wire extends along the line of the second terminals and the fifth terminals, and is connected to the fifth terminals, and
   the second wire extends along the line of the third terminals and the sixth terminals, and is connected to the third terminals.

2. The semiconductor module of claim 1, wherein a portion of the each sixth terminal that is located inside the second sealing resin comprises an anchor portion configured to be pressed to the second sealing resin when the sixth terminal is pulled from the inside toward the outside of the second sealing resin.

3. The semiconductor module of claim 1, wherein the second wire is connected to the sixth terminals.

4. The semiconductor module of claim 1, wherein the second wire is not connected to the sixth terminals.

5. A semiconductor device, comprising:
   a semiconductor chip;
   sealing resin sealing the semiconductor chip;
   a first valid terminal projecting from inside to outside of the sealing resin and connected to the semiconductor chip inside the sealing resin;
   a second valid terminal projecting from the inside to the outside of the sealing resin and connected to the semiconductor chip inside the sealing resin; and
   a dummy terminal projecting from the inside to the outside of the sealing resin and not connected to the semiconductor chip inside the sealing resin,
   wherein a portion of the dummy terminal located inside the sealing resin comprises an anchor portion configured to be pressed to the sealing resin when the dummy terminal is pulled from the inside toward the outside of the sealing resin.

6. A method for manufacturing a first semiconductor device and a second semiconductor device using a common mold, the method comprising:
   manufacturing the first semiconductor device from a first semi-product; and
   manufacturing the second semiconductor device from a second semi-product,
   wherein the common mold comprises:
     a cavity; and
     first, second, and third receiving grooves, each of which is connected to the cavity,
   the first semi-product comprises:
     a first semiconductor chip;

first and third terminals, each of which is connected to the first semiconductor chip; and
a second terminal,
the second semi-product comprises:
a second semiconductor chip;
fourth and fifth terminals, each of which is connected to the second semiconductor chip; and
a sixth terminal spaced from the second semiconductor chip,
the manufacturing of the first semiconductor device comprises:
setting the first semi-product to the common mold so that the first semiconductor chip is located in the cavity, the first terminal is located in the first receiving groove, the second terminal is located in the second receiving groove, and the third terminal is located in the third receiving groove; and
sealing the first semiconductor chip with sealing resin using the common mold after the setting of the first semi-product, and
the manufacturing of the second semiconductor device comprises:
setting the second semi-product to the common mold so that the second semiconductor chip is located in the cavity, the fourth terminal is located in the first receiving groove, the fifth terminal is located in the second receiving groove, and the sixth terminal is located in the third receiving groove; and
sealing the second semiconductor chip with sealing resin using the common mold after the setting of the second semi-product.

* * * * *